US008809966B2

(12) United States Patent
Zundel

(10) Patent No.: US 8,809,966 B2
(45) Date of Patent: Aug. 19, 2014

(54) SEMICONDUCTOR DEVICE

(75) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 1188 days.

(21) Appl. No.: 12/046,760

(22) Filed: Mar. 12, 2008

(65) Prior Publication Data

US 2009/0230561 A1    Sep. 17, 2009

(51) Int. Cl.
*H01L 23/528*   (2006.01)
*H01L 27/088*   (2006.01)

(52) U.S. Cl.
USPC .......................................... 257/401; 257/773

(58) Field of Classification Search
USPC .......................................... 257/331, 401, 773
See application file for complete search history.

(56) References Cited

U.S. PATENT DOCUMENTS

| | | | |
|---|---|---|---|
| 5,355,008 A * | 10/1994 | Moyer et al. | 257/341 |
| 5,763,915 A * | 6/1998 | Hshieh et al. | 257/330 |
| 5,780,364 A | 7/1998 | Thakur | |
| 5,973,360 A * | 10/1999 | Tihanyi | 257/330 |
| 5,973,361 A * | 10/1999 | Hshieh et al. | 257/341 |
| 5,977,609 A | 11/1999 | Soderbarg et al. | |
| 5,986,281 A | 11/1999 | Burchanowski et al. | |
| 6,057,558 A * | 5/2000 | Yamamoto et al. | 257/77 |
| 6,104,060 A * | 8/2000 | Hshieh et al. | 257/329 |
| 6,133,610 A | 10/2000 | Bolam et al. | |
| 6,348,808 B1 | 2/2002 | Yakura | |
| 6,404,025 B1 * | 6/2002 | Hshieh et al. | 257/409 |
| 6,429,502 B1 | 8/2002 | Librizzi et al. | |
| 6,603,173 B1 * | 8/2003 | Okabe et al. | 257/330 |
| 6,696,726 B1 * | 2/2004 | Bencuya et al. | 257/330 |
| 6,897,561 B2 * | 5/2005 | Nemtsev et al. | 257/758 |
| 6,977,416 B2 * | 12/2005 | Nakazawa et al. | 257/330 |
| 7,132,712 B2 * | 11/2006 | Kocon et al. | 257/328 |
| 7,211,862 B2 * | 5/2007 | Nakazawa et al. | 257/330 |
| 7,304,356 B2 * | 12/2007 | Takahashi | 257/401 |
| 7,307,315 B2 | 12/2007 | Wu | |
| 7,348,244 B2 * | 3/2008 | Aoki et al. | 438/270 |
| 7,582,519 B2 * | 9/2009 | Kocon et al. | 438/197 |
| 7,652,326 B2 * | 1/2010 | Kocon | 257/328 |
| 7,855,415 B2 * | 12/2010 | Challa et al. | 257/341 |
| 7,880,225 B2 * | 2/2011 | Matsuura et al. | 257/330 |
| 7,999,312 B2 | 8/2011 | Takaya et al. | |
| 8,013,387 B2 * | 9/2011 | Yedinak et al. | 257/330 |
| 8,044,460 B2 * | 10/2011 | Hirler et al. | 257/331 |
| 8,084,865 B2 * | 12/2011 | Hirler et al. | 257/773 |
| 2002/0030224 A1 * | 3/2002 | Hshieh et al. | 257/329 |
| 2002/0167071 A1 | 11/2002 | Wang | |

(Continued)

OTHER PUBLICATIONS

Final Office Action mailed Nov. 6, 2012 in U.S. Appl. No. 12/640,532.

(Continued)

*Primary Examiner* — Earl Taylor
(74) *Attorney, Agent, or Firm* — Dicke, Billig & Czaja, PLLC

(57) ABSTRACT

A semiconductor device includes an active area having a source and a gate. A gate metal contact is deposited above and forms an electrical contact with the gate and a source metal contact is deposited above and forms an electrical contact with the source. The source metal contact includes a plurality of metal through contacts positioned adjacent a side of the active area, the plurality of metal through contacts being spaced at intervals from one another and arranged in two or more rows.

14 Claims, 2 Drawing Sheets

(56) References Cited

U.S. PATENT DOCUMENTS

| | | | |
|---|---|---|---|
| 2005/0032287 A1* | 2/2005 | Nakazawa et al. | 438/197 |
| 2005/0082591 A1* | 4/2005 | Hirler et al. | 257/302 |
| 2005/0167742 A1* | 8/2005 | Challa et al. | 257/328 |
| 2007/0221950 A1 | 9/2007 | Suzuki et al. | |
| 2007/0293042 A1 | 12/2007 | Kim et al. | |
| 2008/0061403 A1 | 3/2008 | He et al. | |
| 2008/0128803 A1* | 6/2008 | Hirler et al. | 257/331 |
| 2008/0179672 A1 | 7/2008 | Hirler et al. | |
| 2008/0277765 A1 | 11/2008 | Lane et al. | |
| 2009/0230561 A1* | 9/2009 | Zundel | 257/774 |
| 2010/0155879 A1* | 6/2010 | Schulze et al. | 257/503 |

OTHER PUBLICATIONS

Non-Final Office Action mailed May 8, 2013 in U.S. Appl. No. 12/640,532.

Final Office Action mailed Nov. 5, 2013 in U.S. Appl. No. 12/640,532.

* cited by examiner

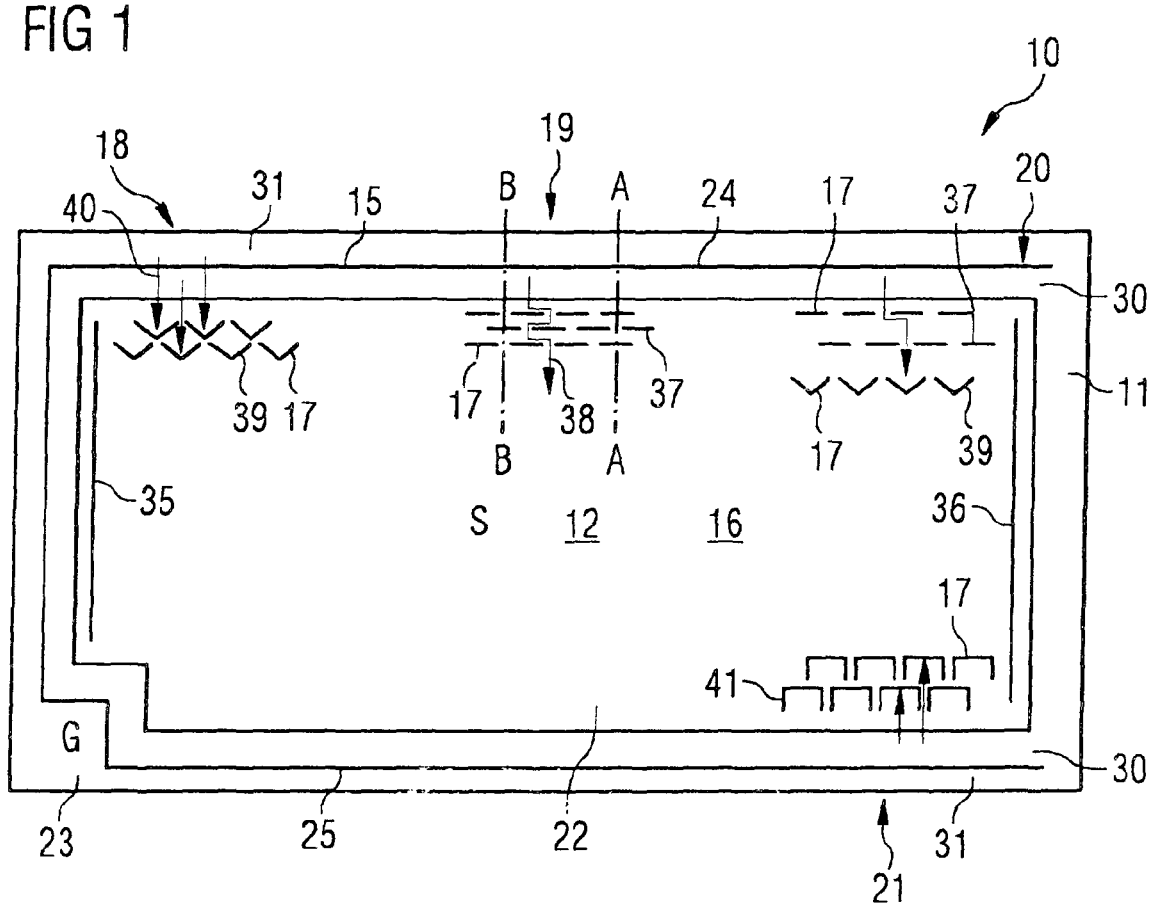

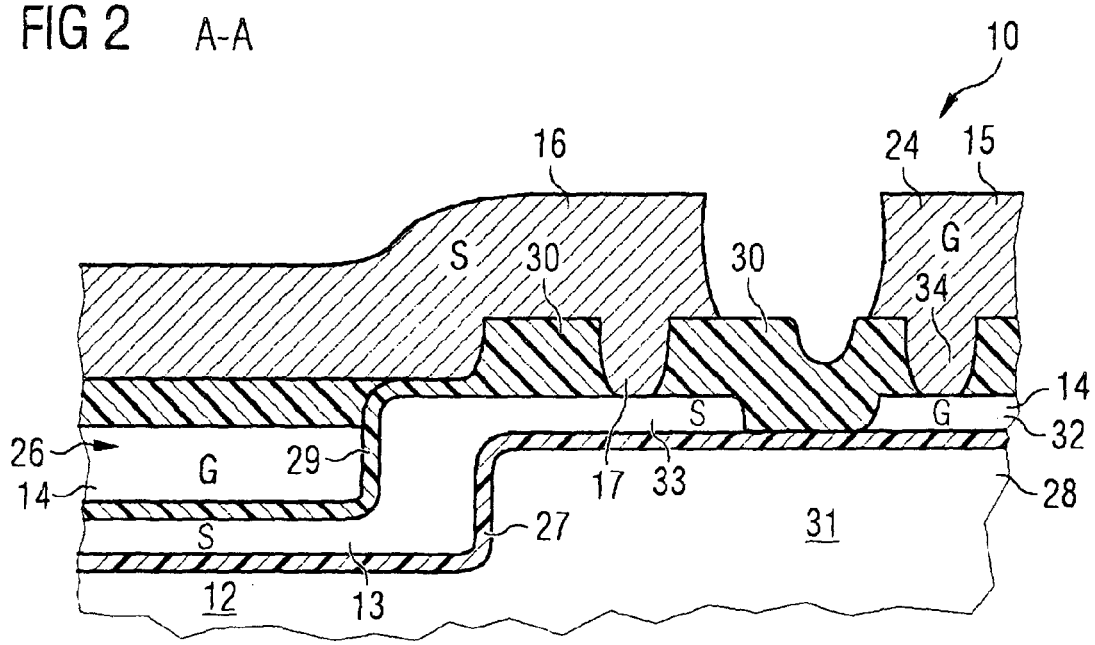
FIG 2  A-A
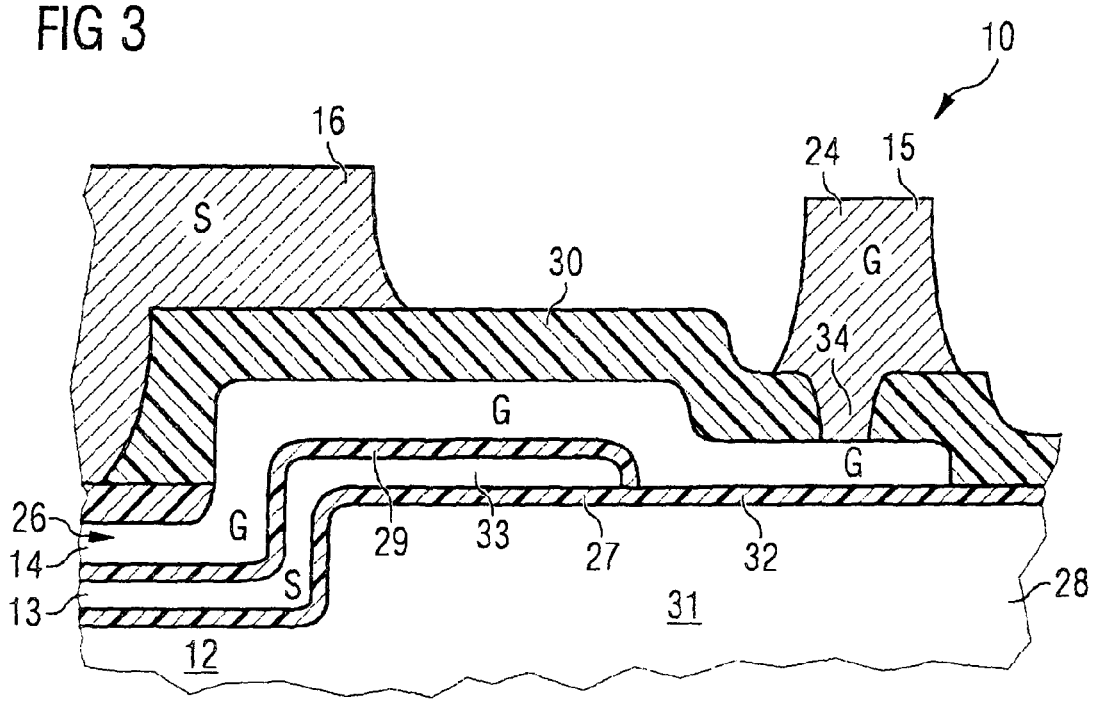
FIG 3

SEMICONDUCTOR DEVICE

BACKGROUND

Contamination of semiconductor devices by mobile ions such as $Na^+$, $K^+$, etc. introduced during the manufacturing process is an issue in semiconductor device manufacturing. Whenever an electric field is maintained across a silicon oxide layer for long periods of time, contaminate mobile ions migrate towards an interface between the silicon oxide and neighbouring material such as silicon. For example, in MOS field effect transistors, the mobile ions tend to accumulate at the junction between the gate oxide and the underlying silicon channel region. The contamination can over time eventually build up to a point where the threshold voltage of the device is noticeably affected which is undesirable.

For these and other reasons, there is a need for the present invention.

SUMMARY

A semiconductor device is provided which has an active area including a source. A source metal contact is deposited above and forms an electrical contact with the source and includes a plurality of metal through contacts which are spaced at intervals from one another and which are arranged in two or more rows. The plurality of metal through contacts are positioned adjacent a side of the active area.

BRIEF DESCRIPTION OF THE DRAWINGS

The accompanying drawings are included to provide a further understanding and are incorporated in and constitute a part of this specification. The drawings illustrate the embodiments and together with the description serve to explain the principles of the invention. Other embodiments and many of the intended advantages will be readily appreciated as they become better understood by reference to the following detailed description. The elements of the drawings are not necessarily to scale relative to each other. Like reference numerals designate corresponding similar parts.

FIG. 1 illustrates a plan view of a semiconductor device.

FIG. 2 illustrates a cross-sectional view along the line A-A of semiconductor device of FIG. 1.

FIG. 3 illustrates a cross-sectional view along the line B-B of the semiconductor device of FIG. 1.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a plan view of a semiconductor device 10 and, in one embodiment, the top side 11 of the semiconductor device 10. FIGS. 2 and 3 illustrate cross-sectional views along the lines A-A and B-B, respectively, indicated in FIG. 1.

The semiconductor device 10 includes an active area 12 including the cell field and a source 13 and a gate 14. The semiconductor device 10 further includes a gate metal contact 15 and a source metal contact 16. The source 13 and gate 14 of the active area 12 are illustrated in the cross-sectional views of FIGS. 2 and 3.

The source metal contact 16 is deposited above and forms an electrical contact with the source 13. This is illustrated in the cross-sectional view of FIG. 2. The gate metal contact 15 is deposited above and forms an electrical contact with the gate 14. This is illustrated in the cross-sectional view of FIG. 3. As used herein, above is used to denote a position not only directly over, but also positions adjacent the gate 14 or source 13, respectively.

The source metal contact 16 includes a plurality of through contacts 17 which are positioned adjacent a side of the active area 12. The plurality of metal through contacts 17 are spaced at intervals from one another and arranged in two or more rows. The spatial arrangement of the plurality of metal through contacts 17 is illustrated in the plan view of FIG. 1. In one embodiment, FIG. 1 illustrates four embodiments of arrangements of the metal through contacts 17 indicated generally by reference numbers 18, 19, 20 and 21.

The semiconductor device 10 is, in this embodiment, a MOSFET device. The top side 11 of the semiconductor device 10 has a central region 22 in which the active area 12 is situated. The active area 12 is covered by the source metal contact 16. Both the semiconductor device 10 and source metal contact 16 have a generally rectangular form.

The top side 11 of a semiconductor device 10 also includes a gate metal contact 15 having a contact area 23 positioned in a corner of the top surface 11 as well as gate runners 24, 25 which extend from the gate contact area 23 along the two long sides of the semiconductor device 10 in the peripheral edge of regions 31 of the top side 11 of the semiconductor device 10. The gate runners 24, 25 are metal. The gate metal contact 15 and the source metal contact 16 may include aluminium and may have a layered structure of different metals or any known metal contact structure.

The gate runner 24 which is arranged in the peripheral edge region 31 opposing the corner in which the gate contact area 23 is arranged also extends along one short side of the semiconductor device 10 to the gate contact area 13. The gate metal contact 15 has a generally U-shaped form and surrounds the source metal contact 16 on three sides.

The gate runners 24, 25 as well as the gate contact area 23 are arranged adjacent and spaced at a distance from the source metal contact 16. The gate contact 15 is electrically isolated from the source metal contact 16 as well as from the source 13 by an electrically insulating layer 30 positioned between the gate contact 15 and the source metal contact 16 and source 13. The electrically insulating layer may be an oxide, a nitride or BPSG (Boron Phosphate Silicate Glass).

In other non-illustrated embodiments, the gate runner may extend the long only one side of the active area 12 or on all four sides of the active area.

As is illustrated in the cross-sectional views of FIGS. 2 and 3, the source 13 and gate 14 of the active area 12 are positioned in a plurality of trenches providing the cell field of the active area 12. A portion of a single trench 26 is illustrated in FIGS. 2 and 3. The source 13 and gate 14 may include polysilicon. The source 13 is positioned towards the bottom of the trench 26 and the gate 14 is arranged on top of the source 13 in the trench 26.

A first electrically insulating oxide layer 27 is arranged over the top surface of the doped silicon substrate 28 of the semiconductor device 10 to electrically insulate the source 13 from the silicon substrate 28. A second oxide layer 29 is arranged over the source 13 in the region of the trench 26 in order to electrically isolate the gate 14 from the source 13. A third oxide layer 30 having a substantially larger thickness is arranged on the gate 14 and extends over the top side of the semiconductor device 10. In regions outside of the active area 12 the third oxide layer 30 has an even greater thickness.

FIG. 2 illustrates that in order to provide an electrical contact to the source 13 positioned at the bottom of the trench 26, the source 13 extends up the side of the trench 26 and into the peripheral region 31 of the semiconductor device 10. The peripheral region 31 surrounds the cell field of the active area 12.

FIG. 3 illustrates that the gate 14 also extends into the peripheral region 31 and, more particularly, the end 32 of the gate 14 is positioned adjacent and outside of the end 33 of the source 13.

The end region 33 of the source 13 and the end region 32 of the gate 14 are positioned adjacent to one another and are electrically insulated from one another by the first oxide layer 27, the second oxide layer 29 and the third oxide layer 30 which cover the end region 33 of the source 13 and end region 32 of the gate 14.

The source metal contact 16 is electrically connected to be source 13 by a plurality of through contacts 17 which extend between the source metal contact 16 through the third oxide layer 30 to the end 33 of the source 13 positioned adjacent the trench 26. Similarly, the gate metal contact 15 is electrically connected to the end region 32 of the gate 14 by a through contact 34 which extends form the gate runner 24 through the oxide layer 30 to the end region 32 of the gate 14.

As is illustrated in the plan view of the top side 11 of the semiconductor device 10 in FIG. 1, the through contact 34 electrically connecting each of the gate runners 24, 25 to the gate 14 is continuous along the length of the gate runner 24. In contrast, the source metal contact 16 is electrically connected to the end 33 of the source 13 by a plurality of metal through contacts 17 which are spaced at intervals from another and which are electrically insulated from one another by the oxide layer 30.

The gate 14 extends from the active area 12 into the peripheral region 31 of the semiconductor device 10 in regions of the top side 11 which are positioned between the metal through contacts 17 electrically connecting the source metal 16 to the source 13. The gate 14 is electrically isolated from the metal through contacts 17 by regions of the oxide layer 30.

The plurality of metal through contacts 17 are arranged towards the peripheral edge of the source contact 16 and are positioned in two or more rows arranged one in front of another and generally parallel to a peripheral edge of the source metal contact 16 and to a side of the active area 12. The through contacts 17, in plan view, may have a variety of forms and arrangements.

In the plan view of the top side 11 of the semiconductor device 10, four embodiments of the metal though contacts 17 are illustrated. The four embodiments are illustrated as separate groups for ease of illustration. However, the plurality of through contacts 17 would in practice extend along the entire side of the source metal contact 16.

If the gate metal contact 15 includes only a single gate runner, the plurality of through contacts 17 would be positioned on only the side of the source metal contact 16 which is directly adjacent the gate runner. In the embodiment illustrated in FIG. 1, a gate runner 24, 25 extends on each of the two long sides of the source metal contact 10. In this embodiment, through contacts 17 are positioned on each of the two long sides of the source metal contact 16.

On the two short sides of the semiconductor device 10 and source metal contact 16 a single through contact 35, 36 extending from the source metal contact 16 to the end 33 of the source 13 is provided. The through contacts 35, 36 extend along the entire short side in contrast to the long side of the source metal contact 16 along which a plurality of metal through contacts 17 are arranged at intervals spaced from one another.

Mobile contaminate ions, such as $Na^+$, $K^+$ etc., diffuse extremely slowly through metals compared to oxides. In the arrangement illustrated in the drawings, these mobile contaminate ions can diffuse along the oxide layer 30 and into the active area 12. Over time, the contamination may build up in the active area 12 to a level such that the threshold voltage of the semiconductor device 10 is affected. The metal through contacts 35, 36 and 17 are arranged to provide a diffusion barrier hindering the migration of mobile ions along the oxide layer 30 into the active area 12.

The long through contacts 35, 36 arranged on the two short sides provide a closed barrier to mobile ion diffusion along these two short sides. Although, in principle, a through contact having a closed ring form which entirely surrounds the active area 12 would provide a continuous diffusion barrier, this arrangement is not practicable if the gate 14 is to be contacted at an end 32 positioned outside the active area 12 and outside of the source metal contact 16.

In order that the gate 14 can be led out to the peripheral edge 31 of the device 10 gaps in the through contact between the source metal contact 16 and the source 13 are provided so that the gate 14 can be positioned in these gaps, that is in the regions between the through contacts. These regions, the oxide layer 30 extends into the active area 12 and provides a path along which the mobile ions may diffuse into the active area 12.

In order to further hinder the diffusion of mobile ions along the oxide layer 30 into the active area 12, the plurality of metal through contacts 17 are arranged in two or more rows. More particularly, the plurality of the contact 17 may be provided, in plan view, with an elongate structure and the long direction may be positioned approximately parallel to the side of the source metal contact 16.

In one embodiment, the metal through contacts 17 of adjacent rows are arranged offset with respect to one another. This embodiment is illustrated in the group 19 with elongate metal through contacts 37. In the case of metal through contacts 37 having a generally rectangular form in plan view, the metal through contacts of one row are arranged so that their center is positioned between adjacent metal through contacts of the adjacent row to provide an offset arrangement. The arrangement of the through contacts of adjacent rows can also be described as a staggered arrangement.

The possible diffusion path for mobile contaminate ions through the oxide layer 30 positioned between the elongated metal through contacts 37 is illustrated by the arrow 38 in FIG. 1. The possible diffusion path 38 has a meandering structure. The gate 14 may extend to the peripheral area 31 in which the gate runner 24 is arranged by positioning it in these regions of the third oxide layer 31 between the metal through contacts 37. The gate 14 may also extend in a meandering fashion between the through contacts 37 from the active area 12 to the gate runner 24 in the peripheral region 31 of the semiconductor device 10.

In an arrangement consisting of a single row of through contacts spaced at intervals the shortest direct path would extend generally perpendicularly to the side of the source metal contact 16. By arranging the metal through contacts 37 in two or more rows with an offset arrangement, the diffusion path takes on a meandering structure and the length of the diffusion path for the mobile ions is increased. Therefore, the time taken for contamination to build up in the active area 12 and to affect the threshold voltage and performance of the device is increased.

In one embodiment, the metal through contacts 17, in plan view, have a funnel shape. Two embodiments with metal through contacts having a funnel shape are illustrated in FIG. 1 and indicated generally by the reference numbers 18 and 21.

In the embodiment generally indicated with reference number 18, each of the through contacts 39 has a generally V-shape in plan view. The through contacts 39 are arranged in two rows such that the apex of the V points in the direction of the active area 12 and the open side faces towards the peripheral edge 31 of the semiconductor device 10.

The through contacts 39 of one row are offset with respect to the through contacts 39 of the other row so that the apex of the V of the through contacts 39 of the first row is positioned between two neighbouring V-shaped through contacts 39 of the other row. This staggered arrangement of the V-shaped through contacts 39 enables the gate 14 to extend in a meandering fashion between the through contacts 39 from the active area 12 to the peripheral area 31 in which the gate runner 24 is arranged.

The V-shaped form provides a trap for the mobile ions as indicated by the arrows 40. The mobile contaminate ions, such as $Na^+$ and $K^+$ migrate through the oxide layer 30 along the shortest possible path which is approximately perpendicular to be side of the source metal contact 16. The mobile contaminate ions may enter the open end of the V-shaped through contact 39 and accumulate within the V-shaped form.

In a MOSFET device in which a more positive voltage, relative to the voltage of the source metal contact, is applied to the gate runner 24, positively charged mobile ions are encouraged away from the gate runner 24 and towards the cell field of the active area 12. Therefore, once the positively charged ions have entered the V-shaped through contact 39, they tend to be trapped there since to diffuse out of the V-shaped through contact 39 they would have to migrate against the favourable diffusion direction set by the voltage difference.

In the embodiment generally indicated with reference number 21, the through contacts 41 have a general U-form with the open side facing in the direction of the gate runner 25 and the closed-end facing towards the active area 12. Mobile contaminate ions which diffuse along the oxide layer 30 can be trapped within the U-shape form of the metal through contacts 41. In this embodiment, the U-shaped metal through contacts 41 of one row are offset with respect to those of the neighbouring row. Mobile ions which diffuse between two U-shaped through contacts 41 of one row enter the centre of the closed-end of the U-shaped through contact 41 of the next row.

In the embodiment indicated generally with reference number 20, a combination of elongated, generally rectangular, metal though contacts 37 and V-shaped through contacts 39 is provided. In this embodiment, the two outermost rows include elongated rectangular metal through contacts 37. The two rows are offset with respect to one another. A third row of V-shaped through contacts 39 is provided on the inner side of the second row of elongated rectangular through context 37. The apex of the V-shaped the metal through contacts 39 is arranged between two metal through contacts 37 of the neighbouring row so that all three rows have an offset or staggered arrangement.

Although the embodiments have been described in the context of mobile contaminate cations, that is positively charged mobile ions, the through contacts may also provide a barrier against the diffusion of mobile anions, that is negatively charged ions, such as $OH^-$, into the active area. Contamination of negatively charged ions is an issue in p-channel devices.

In further non-illustrated embodiments, three for even more rows of through contacts are provided. Furthermore, any number of rows of metal through contacts having different forms are provided. Also, a single row may include the metal contacts having a variety of shapes in plan view.

The semiconductor device 10 is illustrated as a vertical MOSFET device which may operate at a voltage of 20V to 300V, for example. The MOSFET device may be planar or a trenc MOSFET. The through contacts 17 and their arrangement according to one of the embodiments described above may also be used in lateral transistor devices as well as vertical transistor devices, smart-power semiconductor devices and logic semiconductor devices among others.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    a top side having a central region and a peripheral edge region surrounding the central region;
    an active area in the central region comprising a source and a gate and a cell field;
    a gate metal contact arranged in the peripheral edge region deposited above and forming an electrical contact with the gate; and
    a source metal contact covering the active area such that the peripheral edge region is outside the source metal contact, the source metal contact being deposited above and forming an electrical contact with the source and comprising a plurality of metal through contacts positioned adjacent a side of the active area,
    wherein the source metal contact is bordered by two opposite long sides and two opposite short sides, wherein on each of the two short sides a single through contact is provided, and wherein on each of the two long sides a plurality of metal through contacts are arranged at intervals spaced from another.

2. The semiconductor device of claim 1, wherein an electrically insulating layer is disposed between the source metal contact and the source and between the gate metal contact and the gate and wherein the metal through contacts extend through the electrically insulating layer and are disposed on the source.

3. The semiconductor device of claim 1, wherein, in a plan view, the metal through contacts are generally rectangular having a longer and a shorter dimension, the longer direction being arranged generally parallel to the side of the source metal contact.

4. The semiconductor device of claim 1, wherein the plurality of metal through contacts are arranged in two or more adjacent rows, and the metal through contacts of adjacent rows are offset with respect to one another.

5. The semiconductor device of claim 1, wherein, in a plan view, the metal through contacts are generally funnel-shaped.

6. The semiconductor device of claim 1, wherein one or more rows of metal through contacts comprise metal through contacts comprising a generally rectangular shape in a plan view and one or two rows of metal through contacts comprise metal through contacts comprising a generally funnel-shape in the plan view.

7. The semiconductor device of claim 1, wherein the metal through contacts are positioned adjacent two opposing sides of the active area.

8. The semiconductor device of claim 1, wherein the single through contact provided on each of the two short sides comprises a long metal through contact extending along the entire short side.

9. A semiconductor device comprising:
a top side having a central region and a peripheral edge region surrounding the central region;
an active area in the central region comprising a source and a gate and a cell field;
a gate metal contact arranged in the peripheral edge region above and forming an electrical contact with the gate;
a source metal contact covering the active area such that the peripheral edge region is outside the source metal contact, the source metal contact being arranged above and forming an electrical contact with the source and comprising a plurality of metal through contacts positioned adjacent a side of the active area, the plurality of metal through contacts being spaced at intervals from one another and arranged in two or more adjacent rows, the metal through contacts of a first row being arranged offset with respect to an adjacent row,
wherein the source metal contact is bordered by two opposite long sides and two opposite short sides, wherein on each of the two short sides a single through contact is provided, and wherein on each of the two long sides a plurality of metal through contacts are arranged at intervals spaced from one another.

10. A semiconductor device comprising:
a top side having a central region and a peripheral edge region;
an active area in the central region comprising a source and a gate and a cell field, wherein the active area is generally rectangular with short sides and long sides;
a long metal through contact extending along the entire short side of the active area;
a gate metal contact arranged in the peripheral edge region deposited above and forming an electrical contact with the gate; and
a source metal contact covering the active area deposited above and forming an electrical contact with the source and comprising a plurality of metal through contacts positioned adjacent a side of the active area, the plurality of metal through contacts being spaced at intervals from one another and arranged in two or more rows.

11. A semiconductor device comprising:
a top side having a central region and a peripheral edge region;
an active area in the central region comprising a source and a gate and a cell field, wherein the active area is generally rectangular with short sides and long sides;
first and second long metal through contacts extending along opposing short sides of the active area;
a gate metal contact arranged in the peripheral edge region deposited above and forming an electrical contact with the gate; and
a source metal contact covering the active area deposited above and forming an electrical contact with the source and comprising a plurality of metal through contacts positioned adjacent a side of the active area, the plurality of metal through contacts being spaced at intervals from one another and arranged in two or more rows.

12. The semiconductor device of claim 1, wherein the cell field includes a trench, and wherein the source and the gate are positioned in the trench.

13. The semiconductor device of claim 12, wherein an insulating layer separates the source and the gate within the trench.

14. The semiconductor device of claim 12, wherein the source is positioned within the active area, and wherein the gate extends beyond the source to the peripheral edge region.

* * * * *